(12) United States Patent
Jing et al.

(10) Patent No.: US 7,002,811 B2
(45) Date of Patent: Feb. 21, 2006

(54) MOUNTING APPARATUS FOR EXPANSION CARDS

(75) Inventors: Xiao-Zhong Jing, Shenzhen (CN); Qing-Zhi Yang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/948,531

(22) Filed: Sep. 22, 2004

(65) Prior Publication Data

US 2005/0148228 A1    Jul. 7, 2005

(30) Foreign Application Priority Data

Jan. 6, 2004    (TW) .............................. 93200160 U

(51) Int. Cl.
*H05K 7/12* (2006.01)
*H05K 7/14* (2006.01)

(52) U.S. Cl. .................... 361/801; 361/732; 361/747; 361/759

(58) Field of Classification Search ............... 361/726, 361/732, 759, 747, 801
See application file for complete search history.

(56) References Cited

U.S. PATENT DOCUMENTS

| | | | |
|---|---|---|---|
| 5,317,483 A * | 5/1994 | Swindler | 361/801 |
| 5,936,835 A * | 8/1999 | Astier | 361/683 |
| 5,982,627 A * | 11/1999 | Haughton et al. | 361/759 |
| 6,231,139 B1 * | 5/2001 | Chen | 312/223.2 |
| 6,320,752 B1 * | 11/2001 | Jang | 361/740 |
| 6,350,140 B1 * | 2/2002 | Gallagher et al. | 439/327 |
| 6,549,398 B1 * | 4/2003 | Chen | 361/683 |
| 6,693,800 B1 * | 2/2004 | Lin et al. | 361/759 |
| 6,700,791 B1 * | 3/2004 | Zappacosta | 361/759 |
| 2004/0037048 A1 * | 2/2004 | Liao | 361/726 |
| 2004/0074854 A1 * | 4/2004 | Lin et al. | 211/41.17 |
| 2004/0125550 A1 * | 7/2004 | Lin et al. | 361/683 |

\* cited by examiner

*Primary Examiner*—Randy W. Gibson
*Assistant Examiner*—Dameon E. Levi
(74) *Attorney, Agent, or Firm*—Wei Te Chung

(57) ABSTRACT

A mounting apparatus for securing expansion cards (30) with cover plates (34) to a computer includes a chassis (10), a bracket (40) and a mounting member (50). The chassis includes a rear panel (14). The bracket includes a pair of guiding portions (44) for slidably receiving the mounting member. Each guiding portion defines a locating aperture (446) therein. The mounting member includes a main portion (52) and a pair of operating members (59). The main portion includes a base (58), and first and second sidewalls (53, 54). The second sidewall includes a pair of mounting holes (546). Each operating member includes a protrusion (596) and a fastening portion (598). When the operating members are rotated, the fastening portions engage in the locating apertures, the protrusions engage in the mounting holes, the main portion thereby urges the cover plates. Thus the expansion cards are mounted in the chassis.

17 Claims, 5 Drawing Sheets

MOUNTING APPARATUS FOR EXPANSION CARDS

BACKGROUND OF THE INVENTION

1. Field of the Invention

The present invention relates to mounting apparatuses, and more particular to a mounting apparatus for readily and securely mounting expansion cards in a computer enclosure.

2. Description of the Related Art

Generally, in the enclosure of a typical personal computer, there are a lot of expansion cards electrically connected to a motherboard to provide specialized functions. It is required that the expansion cards be reliably retained within the computer enclosure to prevent disengagement from the motherboard when the computer is subjected to shock and vibration during delivery and use thereof.

U.S. Pat. No. 5,317,483 discloses a mounting apparatus for mounting expansion cards to a chassis. The mounting apparatus includes a locking bar having one end pivotally mounted to a support plate of the chassis. After the locking bar is pivoted to a position in which slot covers of the expansion cards are sandwiched between the locking bar and the support plate, the other end of the locking bar is fastened to the support plate with a screw. The expansion cards are thus secured to the chassis.

U.S. Pat. No. 5,936,835 discloses another expansion cards mounting apparatus. The mounting apparatus has a plurality of spring tabs and a mounting portion. After the mounting apparatus is disposed in a position in which the spring tabs press respectively corresponding slot covers of expansion cards, the mounting portion is screwed to a chassis. The expansion cards are thus secured to the chassis.

Both of the above-mentioned mounting apparatus can assemble a plurality of expansion cards synchronously. However, when installing or removing the expansion cards, using the screw fasteners is laborious and time-consuming. In addition, a tool such as a screwdriver or wrench is usually required.

Thus an improved mounting apparatus for expansion cards which overcomes the above-mentioned drawbacks is desired.

SUMMARY OF THE INVENTION

Accordingly, an object of the present invention is to provide a mounting apparatus for readily and efficiently installing expansion cards to and removing expansion cards from equipment such as a chassis of a computer.

To achieve the aforementioned object, a mounting apparatus of the preferred embodiment of the present invention for securing a plurality of expansion cards with cover plates to a computer comprises a chassis, a bracket and a mounting member. The chassis comprises a rear panel. The rear panel has a mounting frame. The bracket is located on a top portion of the rear panel and includes a pair of guiding portions. A locating aperture is defined in each guiding portion. The mounting member slidably received in the guiding portions of the bracket comprises a main portion and a pair of operating members. The main portion includes a base and first and second sidewalls extending upwardly from two opposite edges of the base. A pair of mounting holes is defined in a top portion of the second sidewall thereof. The operating members pivotally secured between the first sidewall and the second sidewall. Each operating member has a protrusion corresponding to the mounting hole of the second sidewall and a fastening portion corresponding to the locating aperture of the bracket. The cover plates are attached to the mounting frame of the rear panel of the chassis, the mounting member is driven downwardly toward the cover plates until the base of the mounting member presses the cover plates, and the operating members are rotated until the fastening portions engage in corresponding locating apertures of the guiding portions of the bracket, the protrusions of the operating members engage in corresponding mounting holes of the main portion of the mounting member, the expansion cards are thereby mounted to the chassis.

Other objects, advantages and novel features of the present invention will be drawn from the following detailed description of the preferred embodiment of the present invention with attached drawings, in which:

DETAIL DESCRIPTION OF THE INVENTION

Figure 1:
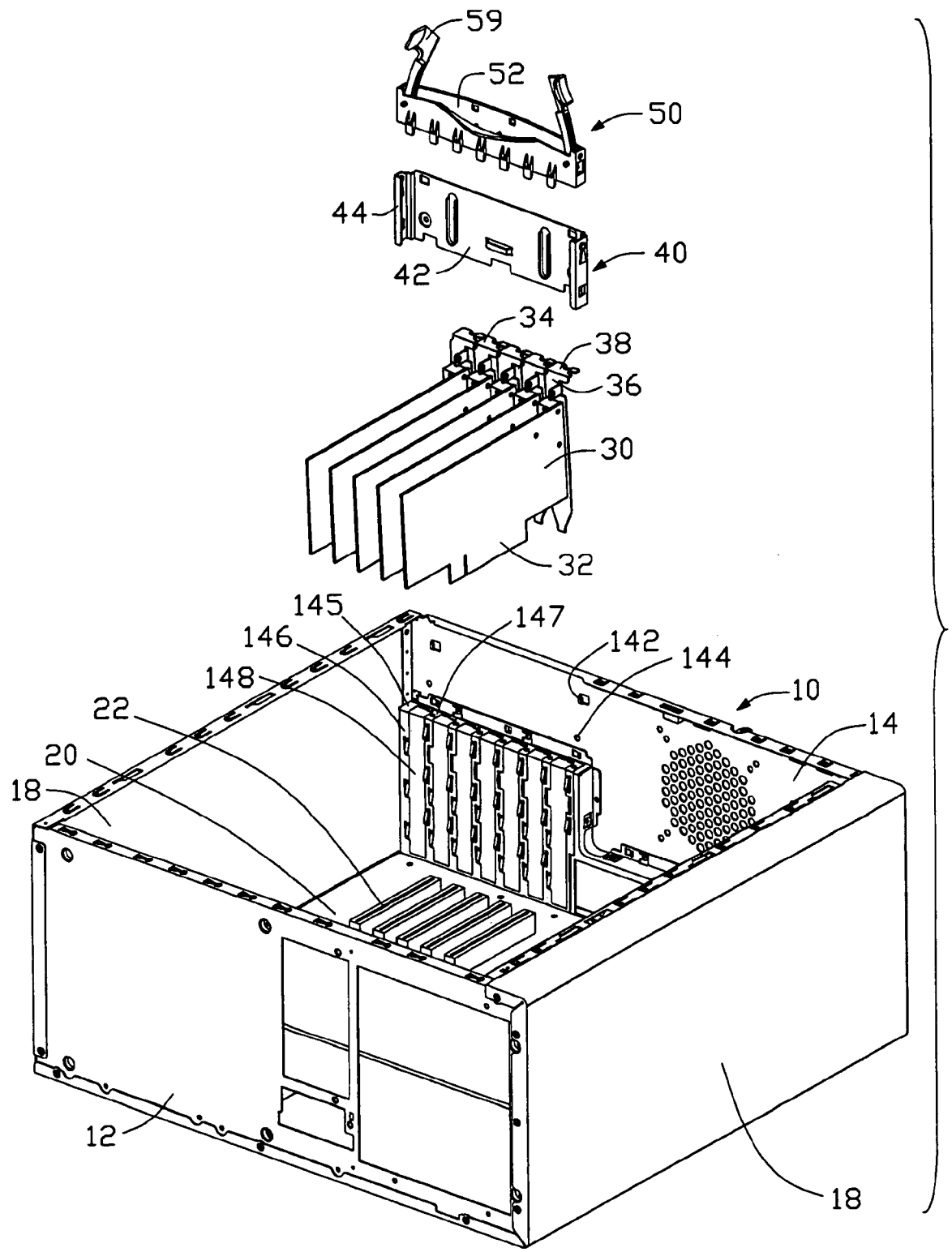
FIG. 1 is an exploded, isometric view of the mounting apparatus in accordance with the preferred embodiment of the present invention, together with cover plates and expansion cards mounted to the cover plates, the mounting apparatus comprises a chassis, a bracket and a mounting member.

Referring to FIG. 1, a mounting apparatus in accordance with the preferred embodiment of the present invention is used to secure a lot of expansion cards 30 to a computer. The mounting apparatus comprises a chassis 10, a bracket 40 and a mounting member 50. The expansion cards 30 are mounted to a lot of cover plates 34.

The chassis 10 comprises a bottom (not visible) and a front panel 12, a rear panel 14, two side panels 18 extending perpendicularly from four edges of the bottom. The rear panel 14 is inwardly stamped to form two hooks 142 at a top portion. Two holes 144 are defined in the rear panel 14 at a bottom portion of the hooks 142 thereof. An L-shaped mounting frame 145 is mounted at a bottom portion of the rear panel 14. The mounting frame 145 defines a plurality of expansion slots 148 and forms a plurality of beams 146 alternating with the expansion slots 148. A bent portion 147 is perpendicularly and backwardly formed from one common end of the beams 146. A motherboard 20 mounted on the bottom of the chassis 10 has a plurality of expansion sockets 22 parallel to the side panels 18, corresponding to the expansion slots 148 of the rear panel 14.

Each expansion card 30 comprises a connector portion 32 extending downwardly from a bottom, corresponding to the expansion socket 22 of the motherboard 20. Each cover plates 34 comprises a mounting plate 36 engaged with the expansion card 30 and a mounting tab 38 bending perpendicularly from a top portion thereof.

Figure 2:
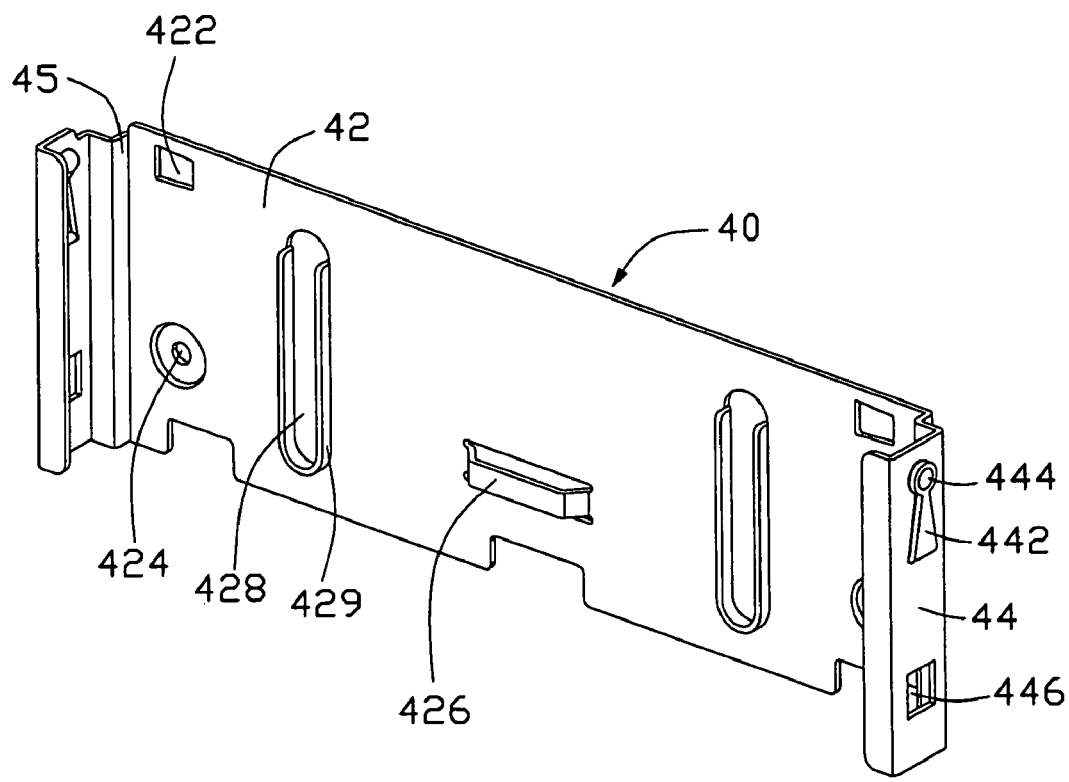
FIG. 2 is an enlarged view of the bracket of FIG. 1.

Referring also to FIG. 2, the bracket 40 comprises a main plate 42 and a pair of U-shaped guiding portions 44 bending severally from two opposite sides of the main plate 42. The main plate 42 defines a pair of apertures 422 corresponding to the hooks 142 of the rear panel 14, and a pair of through holes 424 corresponding to the holes 144 of the rear panel 14. A retaining portion 426 is inwardly stamped in a middle of the main plate 42. Two guiding slots 428 are defined in the main body 42 at both sides of the retaining portion 426 thereof. A U-shaped flange 429 is formed from edges of each guiding slot 428. A connecting portion 45 is deformed between the main plate 42 and the guiding portion 44. The guiding portion 44 is outwardly stamped to form a resilient tab 442 at a top portion. The resilient tab 442 has a locating portion 444 extending inwardly at a distal end thereof. A locating aperture 446 is defined in each guiding portion 44 at a bottom portion thereof.

Figure 3:
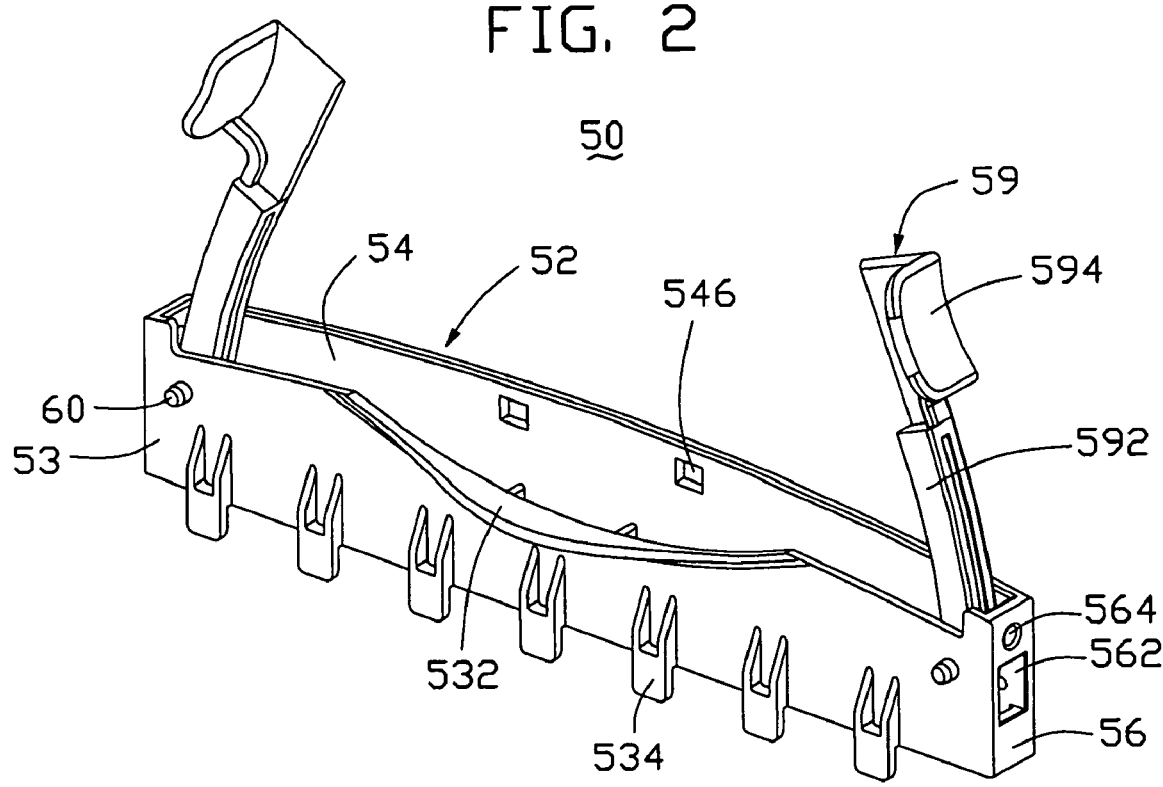
FIG. 3 is an enlarged view of the mounting member of FIG. 1.
Figure 4:
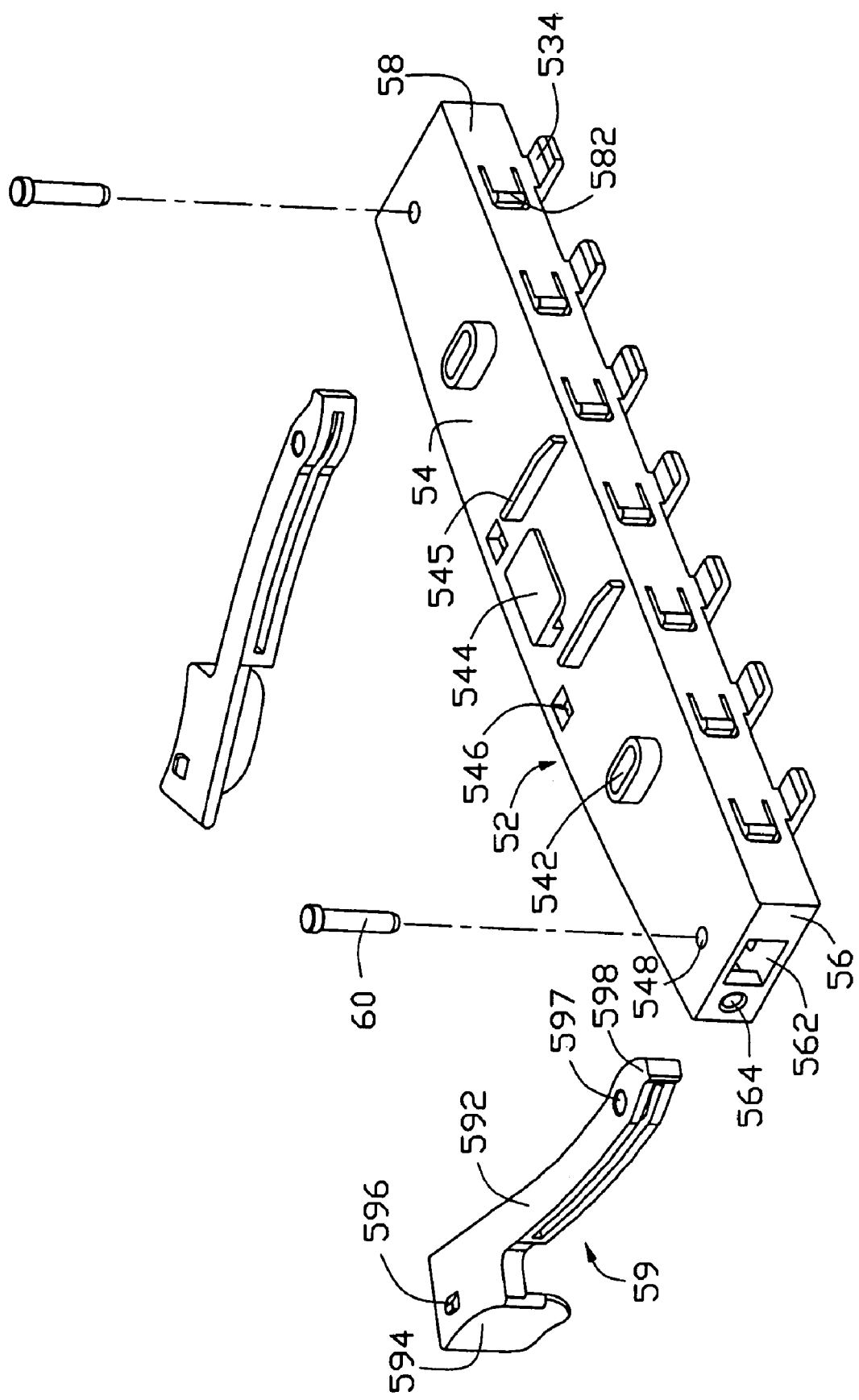
FIG. 4 is an exploded, isometric view of the mounting member of FIG. 2, but viewed from another aspect.

Referring also to FIGS. 3 and 4, the mounting member 50 comprises a main body 52 and a pair of operating members 59 pivotally mounted to the main body 52. The main body 52 comprises a base 58 and a first sidewall 53, a second sidewall 54, a pair of third sidewalls 56 perpendicularly and upwardly bent from four edges of the base 58. The base 58 comprises a plurality of resilient tongues 582, corresponding to the expansion slots 148 of the mounting frame 145. The first sidewall 53 comprises an operation portion 532 extending outwardly from a top portion, and a plurality of tabs 534 extending downwardly from a bottom thereof, corresponding to the expansion slots 148 of the mounting frame 145. The second sidewall 54 comprises a pair of guiding posts 542 corresponding to the guiding slots 428 of the bracket 40. An L-shaped hitching tab 544 is formed between the guiding posts 542, corresponding to the retaining portion 426 of the bracket 40. A pair of supporting portions 545 is formed on the second sidewall 54 respectively between guiding post 542 and the hitching tab 544. The height of the supporting portions 545 is approximately equal to that of the hitching tab 544 thereof. The second sidewall 54 defines two mounting holes 546 at a top portion therein between the guiding posts 542 and corresponding supporting portions 545. A pair of fixing holes 548 is defined through the first sidewall 53 and the second sidewall 54. Each third sidewall 56 defines a through aperture 562 at a bottom portion corresponding to the locating aperture 446 of the bracket 40 and a locating hole 564 at a top portion corresponding to the locating portion 444 of the tab 442 of the bracket 40. Each operating member 59 comprises an arm 592 and an operating tab 594 extending perpendicularly from a top portion end of the arm 592. The arm 592 forms a protrusion 596 at a top portion corresponding to the mounting hole 546 of the second sidewall 54 of the main body 52. A fixing hole 597 is defined in the arm 592 at a bottom portion corresponding to the fixing hole 548 of the first sidewall 53 and second sidewall 54, for securing pivotally corresponding operating member 59 to the main body 52 by a shaft 60 inserting therein. A fastening portion 598 extends from a distal end of the arm 592, corresponding to the through aperture 562 of the main body 52 and the locating aperture 446 of the bracket 40.

Figure 5:
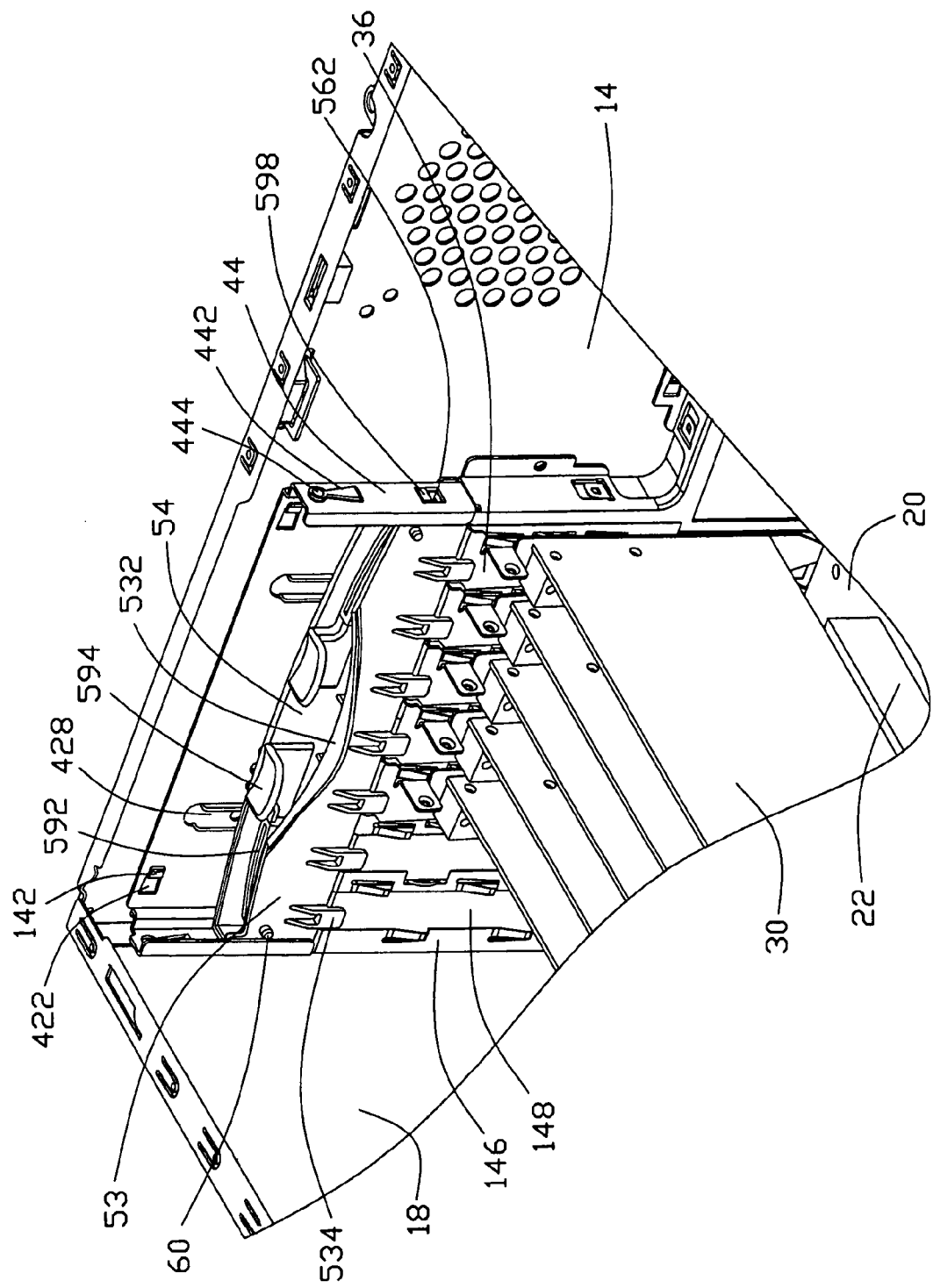
FIG. 5 is an assembled view of FIG. 1, partly cut away.

Referring also to FIG. 5, in assembly, the hooks 142 of the rear panel 14 engage in corresponding apertures 422. The bracket 40 is secured to the rear panel 14 by two fasteners (not shown) such as rivets aligning the holes 424 of the bracket 40 and corresponding holes 144 of the rear panel 14. The mounting member 50 is slidably mounted on the bracket 40 by two third sidewalls 56 received in corresponding guiding portions 44 of the bracket 40. The guiding posts 542 of the mounting member 50 are received in corresponding guiding slots 428 and sliding therein.

When assembling the expansion cards 30 to the mounting apparatus, each locating portion 444 of the bracket 40 is located in corresponding locating hole 564 of the mounting member 50. The connector portions 32 of the expansion cards 30 are plugged into corresponding expansion sockets 22 of the motherboard 20. The cover plates 34 attach to the mounting frame 145 and cover the expansion slots 148. The mounting member 50 slides downwardly along the guiding portion 44 of the bracket 40 by pushing the operation portion 532 of the main body 52. The main body 52 slides on the bracket 40, till the resilient tongues 582 of the main body 52 contact the mounting tabs 38 of the cover plates 34. Meanwhile, the hitching tab 544 of the mounting member 50 hooks the retaining portion 426 of the bracket 40. A top portion edge of the through aperture 562 of the third sidewalls 56 is higher than a top portion edge of corresponding locating aperture 446 of the guiding portion 44 of the bracket 40. Both of the operating members 59 are downwardly rotated around the shafts 60. The fastening portion 598 of the operating member 59 extends through corresponding through aperture 562 and locating aperture 446. The main body 52 further slides downwardly to push the cover plates 34 to the mounting frame 145, till the protrusions 596 of the operating members 59 are received in corresponding mounting holes 546 of the main body 52. Thus, the expansion cards 30 are secured to the chassis 10.

Figure 6:
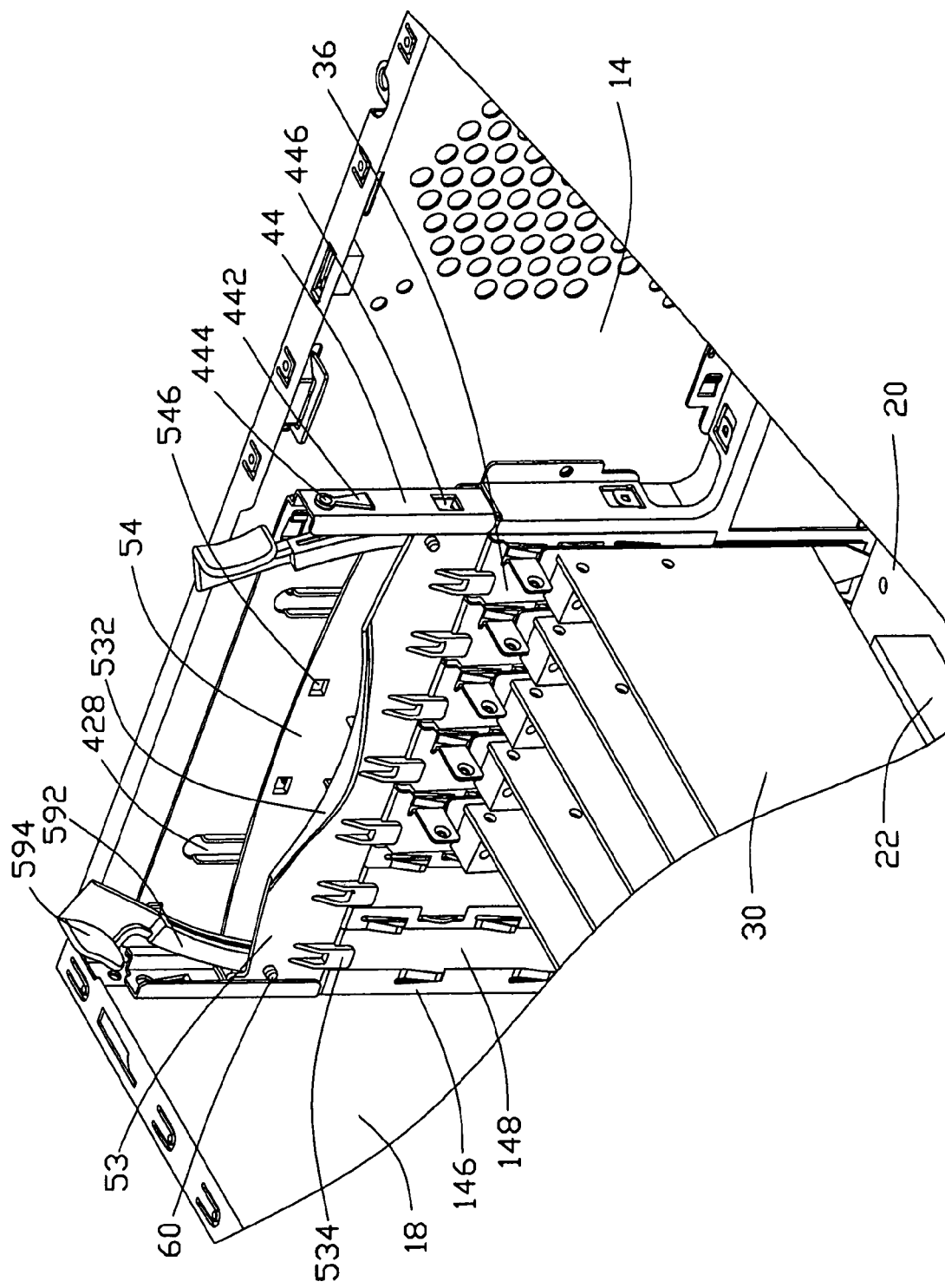
FIG. 6 is similar to FIG. 4, but showing the mounting member in an unlocked position.

Referring to the FIG. 6, when disassembling the expansion cards 30 from the chassis 10, the protrusions 596 of the operating members 59 are released from corresponding mounting holes 546 of the main body 52. The operating members 59 are upwardly rotated around corresponding shafts 60. The fastening portions 598 are released from the upper edges of the locating slots 446 of the guiding portions 44. The main body 52 slides upwardly by pushing the operating portion 532. The resilient tongues 582 release the mounting plates 38 of the cover plates 34. The locating portions 444 of the bracket 40 insert corresponding locating holes 564 of the main body 52. Thus, the expansion cards 30 together with the cover plates 34 can be taken out from the chassis 10.

Alternatively, corresponding structures of the bracket 40 can also be directly formed on the rear panel 14 of the chassis 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for securing a plurality of expansion cards with cover plates to a computer, the mounting apparatus comprising:

a chassis comprising a rear panel, the rear panel having a mounting frame;

a bracket arranged at the rear panel, comprising a pair of guiding portions, a locating aperture defined in each of the guiding portions; and a mounting member slidably received in the guiding portions of the bracket, the mounting member comprising a main portion and a pair of operating members, the main portion comprising a base, and first and second sidewalls extending upwardly from two opposite sides of the base, a pair of mounting holes defined in one of the sidewalls, the operating members pivotally secured between the first and second sidewall, each of the operating members having a protrusion and a fastening portion;

wherein when the cover plates are attached to the mounting frame of the rear panel of the chassis, the mounting member is driven downwardly toward the cover plates until the base of the mounting member presses the cover plates, and the operating members are rotated until the fastening portions engage in corresponding locating apertures of the guiding portions of the bracket, and wherein when the protrusions of the operating members engage in corresponding mounting holes of the main portion of the mounting member, the expansion cards are thereby mounted on the chassis.

2. The mounting apparatus as described in claim 1, wherein the bracket further comprises a main plate, and the guiding portions are bent from two opposite sides of the main plate.

3. The mounting apparatus as described in claim 2, wherein each of the guiding portions of the bracket has a resilient tab above the locating aperture, the tab has a locating portion extending inwardly at a distal end thereof for abutting the mounting member.

4. The mounting apparatus as described in claim 2, wherein two guiding slots are defined in the main plate of the bracket, and the second sidewall of the mounting member comprises two guiding posts slidably received in the guiding slots.

5. The mounting apparatus as described in claim 2, wherein a retaining portion is formed on the main plate of the bracket, and a hitching tab is formed on the second sidewall of the mounting member to engage with the retaining portion.

6. The mounting apparatus as described in claim 1, wherein the main portion of the mounting member further comprises a pair of third sidewalls, each of the third sidewalls defines a through aperture corresponding to the locating aperture of the bracket and a locating hole above the through aperture.

7. The mounting apparatus as described in claim 1, wherein an operating portion is projected from the first sidewall of the main portion of the mounting member, and a plurality of fingers are extended from a bottom portion of the first sidewall.

8. The mounting apparatus as described in claim 1, wherein a plurality of resilient tongues are formed on the base of the main portion of the mounting member for pressing the cover plates.

9. A mounting apparatus for securing expansion cards with cover plates to a computer, the mounting comprising:
   a chassis comprising a rear panel, the rear panel comprising a mounting frame and a pair of guiding portions above the mounting frame, each of the guiding portions defining a locating aperture therein; and
   a mounting member slidably received in the guiding portions of the rear panel, the mounting member comprising a main portion and a pair of operating members, the main portion comprising a base, and first and second sidewalls extending upwardly from two opposite sides of the base, the operating members pivotally secured between the first and second sidewalls, each of the operating members having a fastening portion, an engaging means disposed at the mounting member for retaining the operating members;
   wherein when the cover plates are attached to the mounting frame of the rear panel of the chassis, the mounting member is driven downwardly toward the cover plates until the base of the mounting member presses the cover plates, and the operating members are rotated until the fastening portions engage in corresponding locating apertures of the guiding portions, and wherein when the operating members are secured by the engaging means, the expansion cards are thereby mounted to the chassis.

10. The mounting apparatus as described in claim 9, wherein each of the guiding portions of the rear panel has a resilient tab above the locating aperture, and the tab has a locating portion extending inwardly at a distal end thereof for abutting the mounting member.

11. The mounting apparatus as described in claim 9, wherein two guiding slots are defined in rear panel between the guiding portions, and the second sidewall of the mounting member comprises two guiding posts slidably received in the guiding slots.

12. The mounting apparatus as described in claim 9, wherein a retaining portion is formed on the rear panel between the guiding portions, and a hitching tab is formed on the second sidewall of the mounting member to engage with the retaining portion.

13. The mounting apparatus as described in claim 9, wherein the main portion of the mounting member further comprises a pair of third sidewalls, each of the third sidewalls defines a through aperture corresponding to the locating aperture of the guiding portion and a locating hole above the through aperture.

14. The mounting apparatus as described in claim 9, wherein an operating portion is projected from the first sidewall of the main portion of the mounting member, and a plurality of fingers are extended from a bottom portion of the first sidewall.

15. The mounting apparatus as described in claim 9, wherein the engaging means of the mounting member comprises a pair of the protrusions which are respectively formed at free ends of the operating members, and a pair of the mounting holes defined in one of the sidewalls for engagingly receiving the protrusions.

16. The mounting apparatus as described in claim 9, wherein a plurality of resilient tongues are formed on the base of the main portion of the mounting member for pressing the cover plates.

17. A mounting apparatus assembly comprising:
   a plurality of expansion cards with cover plates thereof;
   a chassis comprising a rear panel with a bent portion thereon;
   a bracket mounted on the rear panel above said bent portion; and
   a mounting member slidably, in a vertical direction, received in the bracket, the mounting member comprising a main portion and at least one operating member, the main portion comprising a base to which said one operating member is pivotally mounted; wherein
   when the cover plates are attached to the rear panel, the mounting member is driven downwardly toward the cover plates until the base of the mounting member contacts the cover plates, and the operating member is rotated until one end of the operating member abuts against one portion of the bracket to result in further downward movement of the mounting member by a reaction force derived from confrontation between the mounting member and the bracket, and such rotation terminates when said operating member reaches a final locking position where said reaction force is maximum, wherein the cover plates are sandwiched between the bent portion and the mounting member in the vertical direction.

* * * * *